(12) United States Patent
Chang

(10) Patent No.: US 7,855,605 B1
(45) Date of Patent: Dec. 21, 2010

(54) AMPLIFIER CIRCUIT

(75) Inventor: Chih-Yao Chang, Tu-Cheng (TW)

(73) Assignee: Chi Mei Communications Systems, Inc., Tu-Cheng, Taipei County (TW)

( * ) Notice: Subject to any disclaimer, the term of this patent is extended or adjusted under 35 U.S.C. 154(b) by 0 days.

(21) Appl. No.: 12/538,249

(22) Filed: Aug. 10, 2009

(30) Foreign Application Priority Data

Jul. 10, 2009 (TW) .............................. 98123372 A

(51) Int. Cl.
*H03F 3/04* (2006.01)
(52) U.S. Cl. ..................... 330/311; 330/306; 330/277
(58) Field of Classification Search ................ 330/311, 330/306, 277, 302
See application file for complete search history.

(56) References Cited

U.S. PATENT DOCUMENTS

| | | | |
|---|---|---|---|
| 6,681,103 B1 * | 1/2004 | Rogers et al. ............... 455/302 |
| 7,221,924 B2 * | 5/2007 | Zheng et al. ................ 455/307 |
| 7,266,360 B2 * | 9/2007 | Kang et al. .................. 455/302 |
| 7,522,024 B2 * | 4/2009 | Beffa .......................... 333/217 |
| 7,629,850 B2 * | 12/2009 | Floyd et al. ................. 330/285 |
| 7,636,021 B2 * | 12/2009 | Rohde et al. ................ 331/167 |
| 2008/0204148 A1 * | 8/2008 | Kim et al. ................... 330/306 |

* cited by examiner

*Primary Examiner*—Patricia Nguyen
(74) *Attorney, Agent, or Firm*—Steven M. Reiss

(57) ABSTRACT

An amplifier circuit includes three amplifier units connected in series. The first amplifier unit includes an input connector for inputting signals and a first transistor amplifier module connected to the input connector. The second amplifier unit includes a notch-filter circuit, a main filter circuit and a second transistor amplifier module. The notch-filter circuit allows only signals in a predetermined frequency to be transmitted from the first transistor amplifier module to the second transistor amplifier module and amplified. The main filter circuit filters signals in frequencies different from the predetermined frequency. The third amplifier unit includes a third transistor amplifier module and an output connector for outputting amplified signals.

18 Claims, 1 Drawing Sheet

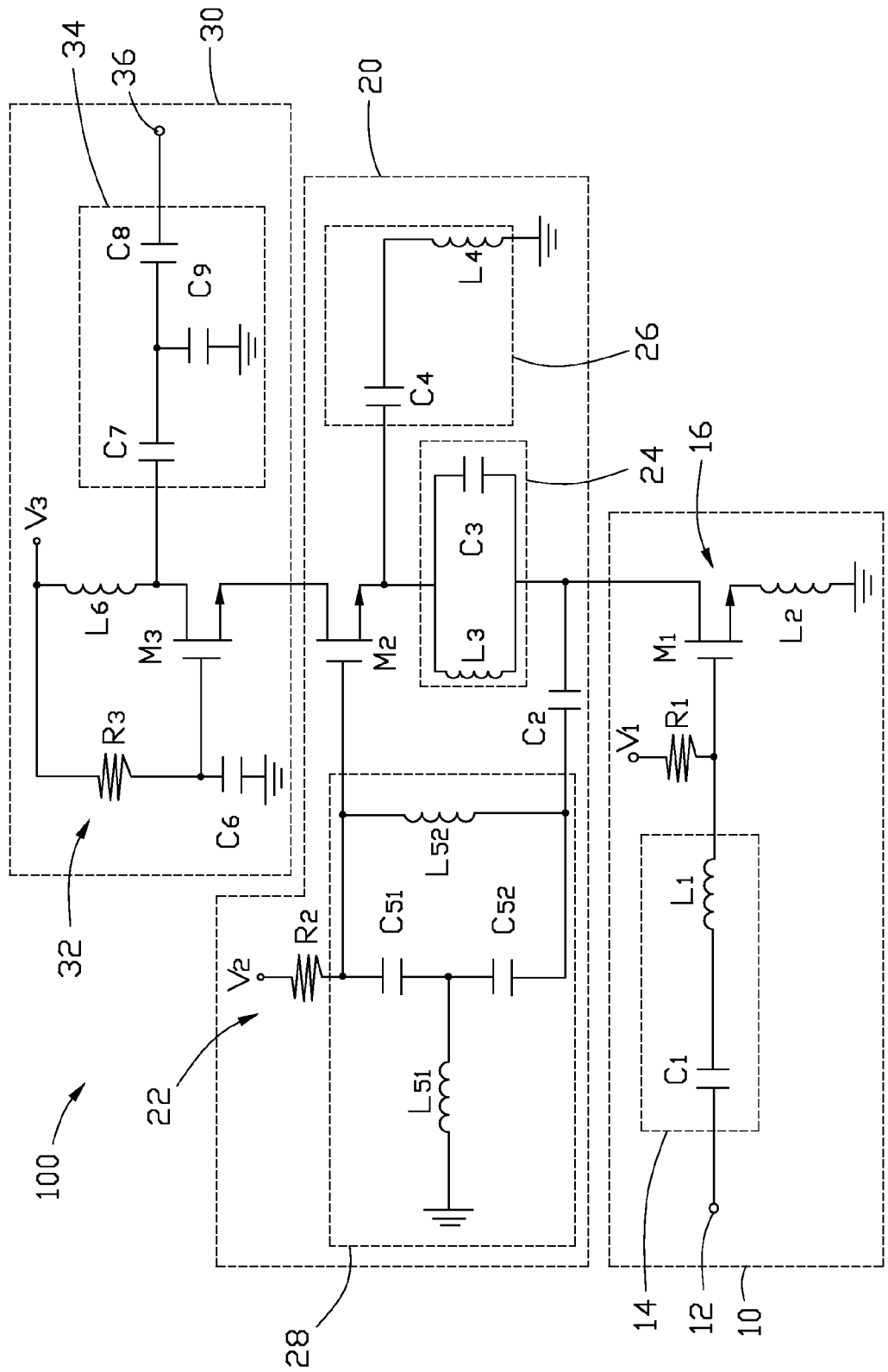

AMPLIFIER CIRCUIT

BACKGROUND

1. Technical Field

The present disclosure relates to amplifier circuits, and particularly to an amplifier circuit capable of rejecting image signals.

2. Description of Related Art

In wireless communication, when wireless signals are received by communication terminals, the communication terminals often need to convert frequencies of the received signals into working signals capable of being transmitted and processed in the communication terminals. However, the frequency conversion operations may generate image signals interfering with wireless communication. Thus, the communication terminals generally require filters used therein for filtering the image signals.

After the frequency conversion operations, the working signals are generally inputted into amplifier circuits to be amplified, and then are transmitted to other functional modules (e.g., decoders or speakers) of the communication terminals to be further processed. Thus, in most communication terminals, the filters for filtering image signals are integrated with the amplifier circuits, such that the image signals are filtered before the working signals are further processed. For example, surface acoustic wave (SAW) filters are often integrated with amplifier circuits of wireless communication terminals to filter image signals. However, conventional filters integrated with the amplifier circuits, such as the SAW filters, are usually expensive, which increases cost of the communication terminals.

Therefore, there is room for improvement within the art.

BRIEF DESCRIPTION OF THE DRAWING

Many aspects of the present amplifier circuit can be better understood with reference to the following drawing. The components in the drawing are not necessarily drawn to scale, the emphasis instead being placed upon clearly illustrating the principles of the present amplifier circuit.

The FIGURE is a circuit diagram of an amplifier circuit, according to an exemplary embodiment.

DETAILED DESCRIPTION

Referring to the figure, an amplifier circuit 100 according to an exemplary embodiment is provided. The amplifier circuit 100 is used in a wireless communication terminal (not shown) such as a mobile phone, a radiogram or an interphone to amplify desired working signals and filter image signals generated in frequency conversion operations. The amplifier circuit 100 includes a first amplifier unit 10, a second amplifier unit 20 and a third amplifier unit 30 connected in series.

The first amplifier unit 10 includes an input connector 12, an input filter circuit 14 and a first transistor amplifier module 16. The input connector 12 is electronically connected to other circuits of the communication terminal to input signals. The input filter circuit 14 includes a capacitor C1 and an inductor L1. The capacitor C1 has one end connected to the feed connector 12 and another end connected to one end of the inductor L1. Another end of the inductor L1 is connected to the first transistor amplifier module 16.

The first transistor amplifier module 16 includes a power supply V1, a first transistor M1, a resistor R1 and an inductor L2. The first transistor M1 is a Complementary Metal Oxide Semiconductor (CMOS) transistor. The inductor L1 has one end connected to the gate of the first transistor M1. The resistor R1 has one end connected to the power supply V1 and another end connected to the gate of the first transistor M1. Thus, the power supply V1 can provide a working electric potential to the first transistor M1 through the resistor R1. The inductor L2 has one end connected to the source of the first transistor M1 and another end grounded.

The drain of the first transistor M1 is connected to the second amplifier unit 20 to input signals. The second amplifier unit 20 includes a second transistor amplifier module 22, a main filter circuit 24, a subsidiary filter circuit 26 and a notch-filter 28. The second transistor amplifier module 22 includes a power supply V2, a second transistor M2, a resistor R2 and a capacitor C2. The second transistor M2 is a CMOS transistor. The resistor R2 has one end connected to the power supply V2 and another end connected to the gate of the second transistor M2. Thus, the power supply V2 can provide a working electric potential to the second transistor M2 through the resistor R2. The main filter circuit 24 includes a capacitor C3 and an inductor L3, which are connected in parallel between the drain of the first transistor M1 and the source of the second transistor M2. The subsidiary filter circuit 26 includes a capacitor C4 and an inductor L4 connected in series, wherein the capacitor C4 has one end connected to the source of the second transistor M2 and another end connected to the inductor L4, and the inductor L4 has one end connected to the capacitor C4 and another end grounded. Thus, the main filter circuit 24 and the source of the second transistor M2 are both connected to the ground via the subsidiary filter circuit 26.

The notch-filter circuit 28 includes two capacitors C51, C52 and two inductors L51, L52. The two capacitors C51, C52 are connected in series between the gate of the second transistor M2 and one end of the capacitor C2. The inductor L51 has one end connected between the capacitors C51, C52 and another end grounded. The inductor L52 has one end connected between the gate of the second transistor M2 and the capacitor C51, and another end connected between the capacitor C52 and the capacitor C2. Another end of the capacitor C2 is connected to the drain of the first transistor M1.

The drain of the second transistor M2 is connected to the third amplifier unit 30 to input signals. The third amplifier unit 30 includes a third transistor amplifier module 32, an output filter circuit 34 and an output connector 36. The third transistor amplifier module 32 includes a power supply V3, a third transistor M3, a resistor R3, a capacitor C6 and an inductor L6. The third transistor M3 is a CMOS transistor. The resistor R3 has one end connected to the power supply V3 and another end connected to the gate of the third transistor M3. Thus, the power supply V3 can provide a working electric potential to the third transistor M3 through the resistor R3. The source of the third transistor M3 is connected to the drain of the second transistor M2. The capacitor C6 has one end connected to the gate of the third transistor M3 and another end grounded. The inductor L6 has one end connected to the power supply V3 and another end connected to the drain of the third transistor M3.

The output filter circuit 34 includes three capacitors C7, C8, C9. The capacitor C7 has one end connected between the inductor L6 and the drain of the third transistor M3 and another end connected to the capacitor C8. The capacitor C8 has one end connected to the capacitor C7 and another end connected to the output connector 36. The capacitor C9 has one end connected between the capacitors C7, C8 and another end grounded.

The amplifier circuit 100 is installed in a wireless communication terminal, e.g., a mobile phone, a radiogram or an interphone. The capacitances of the capacitors C3, C4, C51, C52 and the inductances of the inductors L3, L4, L51, L52 are regulated to set the resonating frequencies of the input filter circuit 24, the main filter circuit 26 and the notch-filter circuit 28. An open circuit resonating frequency of the main filter circuit 24 and a resonating frequency of the notch-filter circuit 28 are set to be equal to a same predetermined frequency of the working signals used by the communication terminal. A short circuit resonating frequency of the subsidiary filter circuit 26 is set to be equal to a frequency of unneeded signals, e.g., image signals generated in the communication terminal.

In use, the communication terminal receives wireless communication signals. The frequency of the received signals is converted, and the signals are then transformed into working signals to be further processed. In the frequency conversion operation, image signals may be generated. The working signals and the image signals both enter the amplifier circuit 100 and are amplified by the first amplifier unit 10. The input filter circuit 10 filters noise signals and the inductor L2 cooperatives with the first transistor M1 to form a source feedback to improve amplifying quality.

The amplified working signals and image signals are both transmitted to the second amplifier unit 20 from the drain of the first transistor M1. The capacitor C2 can further filter noise signals. According to above-mentioned frequency characteristics of the main filter circuit 24, the third filter 26 and the notch-filter circuit 28, the working signals are not able to pass through the main filter circuit 24, and the notch-filter circuit 28 allows only the working signals to pass through. Thus, the desired working signals pass through the notch-filter circuit 28 and are inputted into the gate of the second transistor M2 to be amplified, and the unneeded image signals pass through the main filter circuit 24 and the subsidiary filter circuit 24 to be grounded. In this way, the image signals are filtered.

The working signals are then transmitted from the drain of the second transistor M2 to the source of the third transistor M3. Thus, the first transistor amplifier module 16 and the second transistor amplifier module 22 cooperate with the third transistor amplifier module 32 to form a cascade amplifier, which improves quality of the amplified working signals outputted from the output connector 36. The output filter circuit 40 can filter noises in the outputted working signals.

The amplifier circuit 100 can be widely used in wireless communication terminals. After a communication terminal receives wireless communication signals and converts the frequency of the wireless signals into working signals, the amplifier circuit 100 can both amplify the working signals and filter the image signals generated in the frequency conversion operation. Furthermore, the amplifier circuit 100 can also provide high power plus to the amplified working signals. Understandably, the amplifier circuit 100 can also filter other unneeded signals mixed with the working signals, if only the frequencies of the unneeded signals are different from the frequency of the working signals.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An amplifier circuit, comprising:
   a first amplifier unit including an input connector for inputting signals and a first transistor amplifier module connected to the input connector for amplifying the signals;
   a second amplifier unit including a notch-filter circuit, a main filter circuit and a second transistor amplifier module, the notch-filter circuit and the main filter circuit both connected to the first amplifier unit, the notch-filter circuit connected to the second transistor amplifier module to allow only signals in a predetermined frequency to be transmitted from the first transistor amplifier module to the second transistor amplifier module and amplified, the main filter circuit filtering signals in frequencies different from the predetermined frequency; and
   a third amplifier unit including a third transistor amplifier module connected to the second transistor amplifier module to amplify the signals transmitted from the second transistor amplifier module and an output connector connected to the third transistor amplifier module for outputting amplified signals.

2. The amplifier circuit as claimed in claim 1, wherein the first transistor amplifier module, the second transistor amplifier module and the third transistor amplifier module cooperatively form a cascade amplifier.

3. The amplifier circuit as claimed in claim 1, wherein the resonating frequency of the notch-filter circuit and the open circuit resonating frequency of the main filter circuit are equal to a same desired predetermined frequency.

4. The amplifier circuit as claimed in claim 1, wherein the first amplifier unit includes an input filter circuit connected between the input connector and the first transistor amplifier module to filter noise signals.

5. The amplifier circuit as claimed in claim 4, wherein the first transistor amplifier module includes a first transistor, the first transistor being a CMOS transistor, the gate of the first transistor connected to the input connector via the input filter circuit, the source of the first transistor grounded via an inductor, and the drain of the first transistor connected to the second amplifier unit.

6. The amplifier circuit as claimed in claim 5, wherein the drain of the first transistor is connected to the main filter circuit, and also connected to the notch-filter circuit via a capacitor.

7. The amplifier circuit as claimed in claim 1, wherein the second transistor amplifier module includes a second transistor, the second transistor being a CMOS transistor, the notch-filter connected to the gate of the second transistor, and the drain of the second transistor connected to the third amplifier unit.

8. The amplifier circuit as claimed in claim 7, wherein the second amplifier unit further includes a subsidiary filter circuit, and the main filter circuit is connected to the ground via the subsidiary filter circuit.

9. The amplifier circuit as claimed in claim 8, wherein the source of the second transistor is connected to the ground via the subsidiary filter circuit.

10. The amplifier circuit as claimed in claim 8, wherein a short circuit resonating frequency of the subsidiary filter circuit is equal to a frequency of unneeded signals.

11. The amplifier circuit as claimed in claim 7, wherein the third transistor amplifier module includes a third transistor, the third transistor being a CMOS transistor, the source of the third transistor connected to the drain of the second transistor, and the drain of the third transistor connected to the output connector via an inductor.

12. The amplifier circuit as claimed in claim 11, wherein the third amplifier unit further includes an output filter circuit connected between the drain of the third transistor and the output connector to filter noise signals.

13. An amplifier circuit, comprising:
- an input connector for inputting signals;
- a first transistor amplifier module connected to the input connector;
- a notch-filter circuit and a main filter circuit both connected to the first transistor amplifier module;
- a second transistor amplifier module connected to the notch-filter circuit;
- a third transistor amplifier module connected to the second transistor amplifier module; and
- an output connector connected to the third transistor amplifier module for outputting signals; wherein the first transistor amplifier module, the second transistor amplifier module and the third transistor amplifier module cooperatively form a cascade amplifier to amplify signals, the notch-filter circuit allows only signals in a predetermined frequency to be transmitted from the first transistor amplifier module to the second transistor amplifier module, and the main filter circuit filtering signals in frequencies different from the predetermined frequency.

14. The amplifier circuit as claimed in claim 13, wherein the resonating frequency of the notch-filter circuit and the open circuit resonating frequency of the main filter circuit are equal to a same desired predetermined frequency.

15. The amplifier circuit as claimed in claim 13, further comprising an input filter circuit connected between the input connector and the first transistor amplifier module to filter noise signals.

16. The amplifier circuit as claimed in claim 13, further comprising a subsidiary filter circuit, and the main filter circuit is connected to the ground via the subsidiary filter circuit.

17. The amplifier circuit as claimed in claim 16, wherein a short circuit resonating frequency of the subsidiary filter circuit is equal to a frequency of unneeded signals.

18. The amplifier circuit as claimed in claim 13, wherein further comprising an output filter circuit connected between the drain of the third transistor and the output connector to filter noise signals.

* * * * *